United States Patent
Nawano

(10) Patent No.: US 8,807,710 B2
(45) Date of Patent: Aug. 19, 2014

(54) METHOD OF MANUFACTURING LIQUID EJECTING HEAD, PIEZOELECTRIC ELEMENT, AND LIQUID EJECTING DEVICE

(71) Applicant: Seiko Epson Corporation, Tokyo (JP)

(72) Inventor: Masahisa Nawano, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/783,841

(22) Filed: Mar. 4, 2013

(65) Prior Publication Data

US 2013/0229464 A1 Sep. 5, 2013

(30) Foreign Application Priority Data

Mar. 5, 2012 (JP) .................................. 2012-048634

(51) Int. Cl.
*B41J 2/045* (2006.01)

(52) U.S. Cl.
USPC .......................................................... 347/68

(58) Field of Classification Search
USPC .......................................................... 347/68
See application file for complete search history.

(56) References Cited

U.S. PATENT DOCUMENTS

| 7,586,234 B2 * | 9/2009 | Miyazawa et al. ............. 310/311 |
| 2007/0241642 A1 | 10/2007 | Miyazawa et al. |
| 2008/0067898 A1 * | 3/2008 | Aoki et al. ..................... 310/358 |
| 2010/0320871 A1 | 12/2010 | Suenaga et al. |

FOREIGN PATENT DOCUMENTS

| JP | 2001-223404 | 8/2001 |
| JP | 2007-287745 | 11/2007 |
| JP | 2011-029591 | 2/2011 |
| JP | 2011-071150 | 4/2011 |

* cited by examiner

*Primary Examiner* — Alessandro Amari
*Assistant Examiner* — Michael Konczal
(74) *Attorney, Agent, or Firm* — Harness, Dickey & Pierce, P.L.C.

(57) ABSTRACT

A piezoelectric element equipped with a piezoelectric layer and an electrode provided on the piezoelectric layer, comprising the piezoelectric layer, which is made from a complex oxide having a perovskite structure containing Bi, Fe, Ba and Ti, and which has a residual stress of 250 MPa or more, and a method of manufacturing a liquid ejecting head equipped with a piezoelectric layer and an electrode provided on the piezoelectric layer, the method including forming the piezoelectric layer, which is made from a complex oxide having a perovskite structure containing Bi, Fe, Ba and Ti, and which has a residual stress of 250 MPa or more.

2 Claims, 9 Drawing Sheets

METHOD OF MANUFACTURING LIQUID EJECTING HEAD, PIEZOELECTRIC ELEMENT, AND LIQUID EJECTING DEVICE

The entire disclosure of Japanese Patent Application No. 2012-048634, filed Mar. 5, 2012 is incorporated by reference herein.

BACKGROUND

1. Technical Field

The present invention relates to a method of manufacturing a liquid ejecting head, which is equipped with a piezoelectric element having a piezoelectric layer made of a piezoelectric material, and an electrode, and which discharges liquid droplets from a nozzle opening, a liquid ejecting apparatus, and a method of manufacturing a piezoelectric element.

2. Related Art

As a typical example of a liquid ejecting head, there is an ink jet type recording head in which a part of a pressure generating chamber, which communicates with a nozzle which discharges ink droplets, is configured by a vibrating plate, the vibrating plate being deformed by a piezoelectric element to pressurize ink in the pressure generating chamber and cause the nozzle to discharge the ink as ink droplets. As a piezoelectric element used in an ink jet type recording head, there is a piezoelectric element configured by a piezoelectric material offering a function of electromechanical conversion, for example, a piezoelectric layer (piezoelectric film) made from a crystallized dielectric material, interposed between two electrodes.

High piezoelectric properties are required for the piezoelectric material used as a piezoelectric layer forming this kind of piezoelectric element. As a typical example of the piezoelectric element, lead zirconate titanate (PZT) can be exemplified (see JP-A-2001-223404). However, from the point of view of environmental issues, a piezoelectric material which is lead-free or in which the lead content has been suppressed, is required, for example, $BiFeO_3$ class piezoelectric materials which contain Bi and Fe (for example, JP-A-2007-287745).

However, the strain amount of a piezoelectric layer, made from this kind of complex oxide which is lead-free or has a suppressed lead content, is inadequate compared to lead zirconate titanate, and therefore an increase in the strain amount is desirable. Further, this problem not only exists in ink jet type recording heads, but naturally with other liquid ejecting heads which discharge droplets of liquid other than ink, and the same problem also exists in piezoelectric elements which are used in anything other than liquid ejecting heads.

SUMMARY

An advantage of some aspects of the invention is to provide a method of manufacturing a liquid ejecting head equipped with a piezoelectric element which has a piezoelectric layer, with a large strain amount and with a small environmental impact, a liquid ejecting apparatus, and a method of manufacturing a piezoelectric element.

According to an aspect of the invention, there is provided a method of manufacturing a liquid ejecting head equipped with a pressure generating chamber, which communicates with a nozzle opening, and a piezoelectric element having a piezoelectric layer and an electrode provided on the piezoelectric layer, the method including forming the piezoelectric layer, which is made from a complex oxide having a perovskite structure containing Bi, Fe, Ba and Ti, and has a residual stress of 250 MPa or more, on the electrode.

In such an aspect, in the manufacturing of the piezoelectric layer made from a complex oxide having a perovskite structure containing Bi, Fe, Ba and Ti, by forming a piezoelectric layer having a residual stress of 250 MPa or more, it is possible to manufacture a liquid ejecting head in which the strain amount, that is, the displacement, is significantly increased. Further, due to lead-free or suppressed lead content, it is possible to achieve a reduced environmental impact.

According to another aspect of the invention, there is provided a liquid ejecting apparatus equipped with a liquid ejecting head which has been manufactured by the method of manufacturing a liquid ejecting head described above. According to this aspect, since a piezoelectric element with a reduced environmental impact and having a large strain amount is equipped in a liquid ejecting apparatus, outstanding piezoelectric characteristics (strain amount) can be achieved.

According to still another aspect of the invention, there is provided a method of manufacturing a piezoelectric element equipped with a piezoelectric layer and an electrode provided on the piezoelectric layer, the method including forming the piezoelectric layer, which is made from a complex oxide having a perovskite structure containing Bi, Fe, Ba and Ti, and which has a residual stress of 250 MPa or more, on the electrode. Accordingly, upon forming a piezoelectric layer made from a complex oxide having a perovskite structure containing Bi, Fe, Ba and Ti, a piezoelectric layer with a residual stress of 250 MPa or more is formed, thereby a piezoelectric element with significantly increased strain amount can be manufactured. Further, due to lead-free or suppressed lead content, it is possible to achieve a reduced environmental impact.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
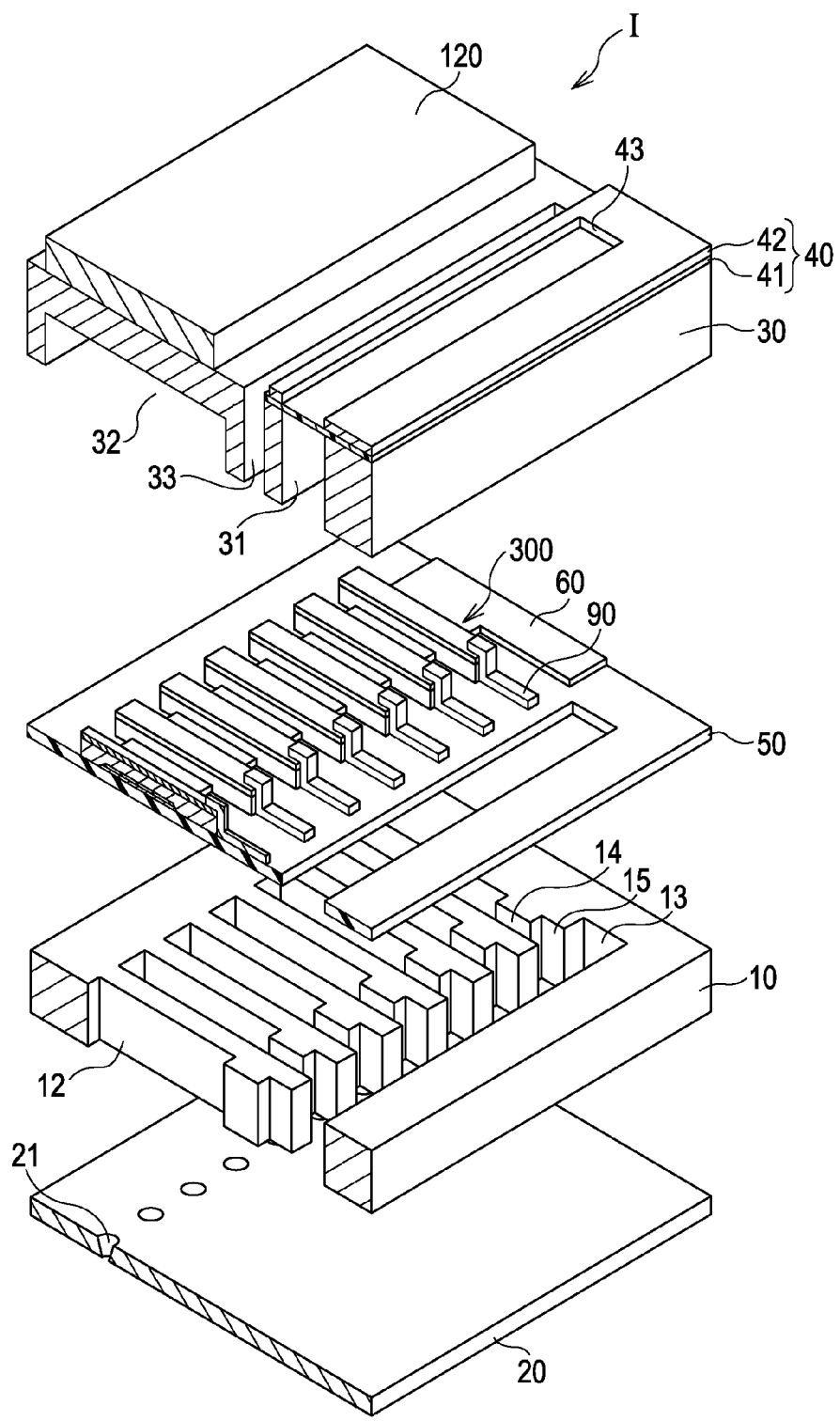
FIG. 1 is an exploded perspective view showing the overall structure of a recording head according to Embodiment 1 of the invention.
Figure 2:
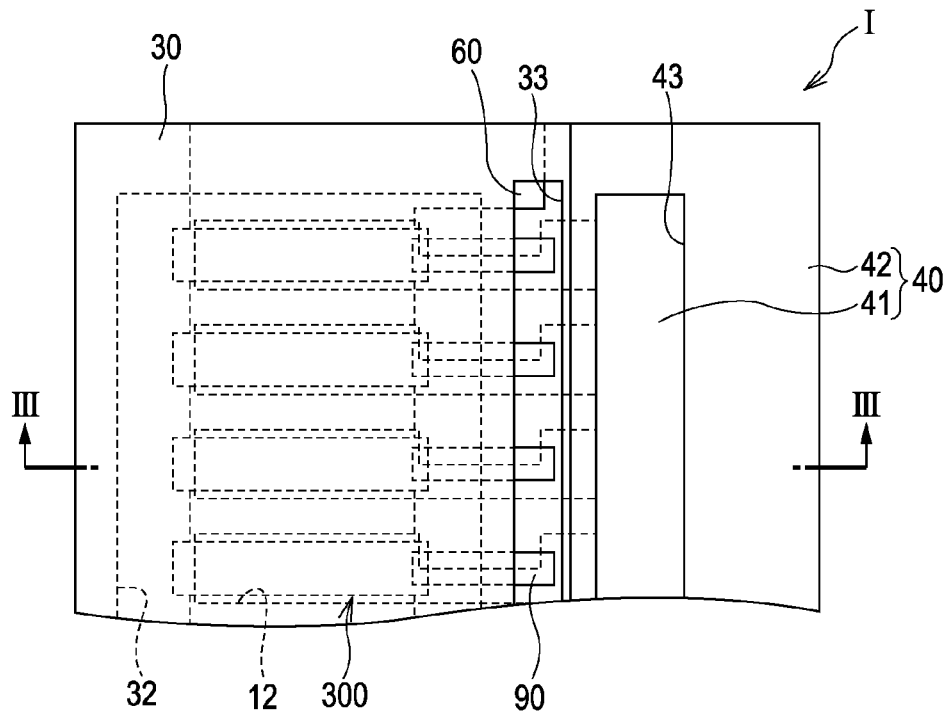
FIG. 2 is a plan view of a recording head according to Embodiment 1 of the invention.
Figure 3:
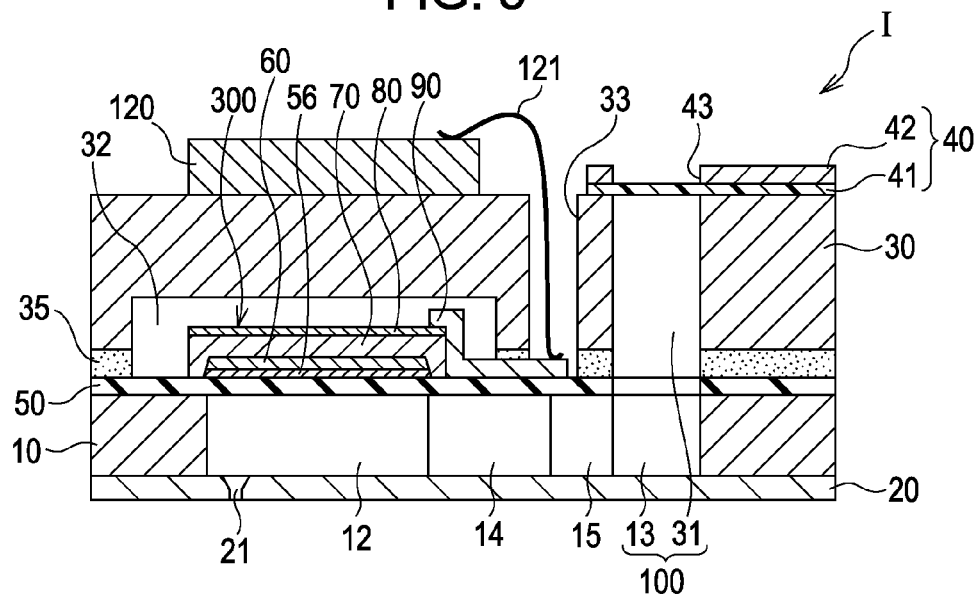
FIG. 3 is a cross sectional view of a recording head according to Embodiment 1 of the invention.

FIG. 1 is an exploded perspective view showing the overall structure of an ink jet type recording head, which is an example of a liquid ejecting head, manufactured using the manufacturing method according to Embodiment 1 of the invention. FIG. 2 is a plan view of FIG. 1, and FIG. 3 is a cross sectional view taken along line III-III of FIG. 2. As shown in FIGS. 1 to 3, the flow passage forming plate 10 of this embodiment is made from a silicon monocrystal substrate with an elastic film 50 made from silicon dioxide, formed on one surface of the flow passage forming plate 10.

A plurality of pressure generating chambers 12 are provided in parallel along the width direction of flow passage forming plate 10. Also, a communicating portion 13 is formed in the flow passage forming plate 10 in a region outside, in a longitudinal direction, of the pressure generating chambers 12. The communicating portion 13 communicates with each of the pressure generating chambers 12 via an ink supply passage 14 and a communicating passage 15 which are provided for each of the pressure generating chambers 12. The communicating portion 13 communicates with a manifold portion 31 of a protective plate described below, and forms a part of the manifold which is a common ink chamber for each of the pressure generating chambers 12. The width of ink supply passage 14 is formed to be narrower than the pressure generating chamber 12 and maintains a constant flow resistance to the ink flowing into the pressure generating chamber 12 from the communicating portion 13. In the present embodiment, the ink supply passage 14 is formed by restricting the width from one side of the flow path, however, the width of the flow path may be restricted from both sides of the flow path to form the ink supply passage. Also, the ink supply passage may be formed, not by restricting the width of the flow path, but by restricting the width in the thickness direction. The liquid flow path of the present embodiment is formed in the flow passage forming plate 10 by the pressure generating chamber 12, the communicating portion 13, the ink supply passage 14, and the communicating passage 15.

Further, a nozzle plate 20, which has nozzle openings 21 drilled to communicate with the proximity of the end side opposite the ink supply passage 14 of each of the pressure generating chambers 12, is fixed to an opening surface side of the flow passage forming plate 10 by adhesive or thermal welding film or the like. Also, the nozzle plate 20 is made from, for example, glass ceramics, silicon monocrystal substrate, stainless steel or the like.

Meanwhile, on the side opposite the opening surface side of this kind of flow passage forming plate 10, the elastic film 50 described above is formed, and on the elastic film 50, there is provided an adhesive layer 56, made from, for example, titanium oxide having a thickness of from 30 nm to 50 nm, to increase adhesion of the elastic film 50 and the like to the base of a first electrode 60. Titanium oxide was used for the adhesive layer 56 of the present embodiment, however the material of the adhesive layer 56 changes according to the type and the like of the first electrode 60 and its base, but for example, oxides or nitrides including zirconium and aluminum, $SiO_2$, MgO, $CeO_2$ and the like may be used. Also, an insulating film made from zirconium oxide or the like may be provided as required on elastic film 50.

Further, on top of this adhesive layer 56, the first electrode 60, a piezoelectric layer 70, which is a thin film having a thickness of equal to or less than 3 μm and preferably 0.3 μm to 1.5 μm, and a second electrode 80, are laminated to form piezoelectric element 300 as a pressure generating unit to generate a pressure change in the pressure generating chamber 12. Here, piezoelectric element 300 refers to the part including the first electrode 60, the piezoelectric layer 70 and the second electrode 80. Generally, one of either of the electrodes of the piezoelectric element 300 is set as a common electrode, and the other electrode or the piezoelectric layer 70 is formed by patterning for each of the pressure generating chambers 12. In the present embodiment, the first electrode 60 is set as the common electrode of the piezoelectric element 300, and the second electrode 80 is made the individual electrode of the piezoelectric element 300, however, these may be reversed for the convenience of the driving circuit or wiring. Also, the piezoelectric element 300 and a vibrating plate, in which displacements are generated by operation of the piezoelectric element 300, are collectively referred to as an actuator device. In the above described example, the elastic film 50, the adhesive layer 56, the first electrode 60, and an insulating film if required, act as the vibrating plate, however this is not restricted and, for example, the elastic film 50 or the adhesive layer 56 may be omitted. Also, the piezoelectric element 300 itself may substantially serve as a vibrating plate.

The piezoelectric element 70 is made from a complex oxide having a perovskite structure containing bismuth (Bi), iron (Fe), barium (Ba) and titanium (Ti). Also, as will be described in detail below, it is manufactured with a process of forming the piezoelectric layer 70 with a residual stress of equal to or more than 250 MPa. This kind of piezoelectric layer 70, as described in Examples below, results in a liquid ejecting head having a piezoelectric element 300 with a large displacement. The residual stress of the piezoelectric layer 70 changes in the latter stages of the manufacturing process of the piezoelectric layer 70, in other words, for example, it is changed by the process of forming the pressure generating chamber 12 and the like, and the residual stress of the piezoelectric layer 70 of the finally manufactured ink jet type recording head will not be more than 250 MPa.

As will be described in more detail below, the residual stress of the piezoelectric layer 70 formed by the piezoelectric layer 70 formation process described above is prepared by adjusting the kind and ratio of the constituent elements of piezoelectric layer 70, for example, by adjusting the composition ratio of the metallic elements constituting the piezoelectric layer 70, for example, Ti/Ba which is the molar ratio of Ti and Ba, manufacturing the piezoelectric layer 70 using two or more types of precursor solution such as forming a first piezoelectric layer by a chemical solution method using a first precursor solution containing Bi, Ba, Fe and Ti, and forming a second piezoelectric layer on this first piezoelectric layer by a chemical solution method using a second precursor solution containing Li, B, or Cu in addition to Bi, Ba, Fe and Ti, changing the firing conditions such as firing temperature, adjusting the material and thickness of a substrate or the elastic film 50, the insulating film, the adhesive layer 56, and the lower electrode 60, and the orientation of piezoelectric layer 70, provided on the substrate.

A piezoelectric layer 70 manufactured by this kind of manufacturing method, as described above, is made from a complex oxide having a perovskite structure containing Bi, Fe, Ba and Ti. The perovskite structure, in other words, a structure in which the A-site of an $ABO_3$ structure is configured by 12 oxygen atoms, and the B-site is configured by 6 oxygen atoms, forms an eight sided body (octahedron). Positioned in the A-site is Bi or Ba, and in the B-site is Fe or Ti.

The detailed structure of the piezoelectric layer 70, is, for example, as follows.

An example of a complex oxide for forming the piezoelectric layer 70 is one in which the ratio of the total molar quantity of Bi and Ba to the total molar quantity of Fe and Ti (Bi+Ba):(Fe+Ti)=1:1, however, as long as a perovskite structure can be achieved, naturally shifting of the composition by lattice mismatch, oxygen deficiency or the like, or replacement of a portion of the elements is allowable. For example, Ti/Ba, which is the molar ratio of Ti and Ba, for the piezoelectric layer 70, is more than 1, and preferably more than or equal to 1.17 and less than or equal to 1.45. In addition, it is preferable for Bi/Ba to be more than or equal to 2.3 and less than or equal to 4.0. The composition of this kind of piezoelectric layer 70 can be represented by Formula (1) below. Here, the composition notation of Formula (1) is based on stoichiometric notation, and as stated above, as long as a perovskite structure can be achieved, naturally shifting of the composition by lattice mismatch, oxygen deficiency or the like, or replacement of a portion of the elements is allowable. For example, if the stoichiometric value is 1, a value in the range of 0.85 to 1.20 is allowable.

$$(Bi_{1-a}Ba_a)(Fe_{1-b}Ti_b)O_3 \quad (1)$$

(where, $1<b/a$, preferably $1.17 \le b/a \le 1.45$, $2.3 \le (1-a)/a \le 4.0$)

Further, in addition to Bi, Fe, Ba, and Ti, elements may be included to improve the desired characteristics of this kind of complex oxide constituting piezoelectric layer 70. As examples of other elements, Mn or Co can be exemplified, and either of Mn and Co may be used. Of course, in the case of a complex oxide containing other elements, it is essential that it has a perovskite structure.

In cases where piezoelectric layer 70 contains Mn or Co, the Mn or Co is positioned in the B-site, and it is presumed that a complex oxide having a structure in which a portion of the Fe atoms have been replaced where Mn or Co are positioned in the B-site. For example, in the case where Mn is included, the complex oxide constituting piezoelectric layer 70 has basically the same characteristics as when Mn or Co are not included, but through the addition of Mn or Co, leak characteristics are improved. Specifically, the occurrence of leaking is suppressed. Also, an example using Mn and Co was described, however, it is known that in cases where transition metal elements other than Mn and Co such as Cr, Ni, and Cu are included, or in cases where two or more of the above transition metal elements are included, there is the same improvement in leak characteristics, and they may be used for piezoelectric layer 70, and further, other widely known additives may be included to improve the characteristics.

As this kind of complex oxide constituting piezoelectric layer 70, for example, the ratio of the total molar quantity of the A-site element to the total molar quantity of the B-site element (A-site element total molar quantity):(B-site element total molar quantity)=1:1 can be exemplified, however, as long as a perovskite structure can be achieved, naturally shifting of the composition by lattice mismatch, oxygen deficiency or the like, or replacement of a portion of the elements is allowable. The composition of this kind of piezoelectric layer 70, which is made from a complex oxide having a perovskite structure containing, in addition to Bi, Fe, Ba and Ti, at least one of Mn, Co and other transitional metal elements can be represented, for example, by the mixed crystal of Formula (2) below. In Formula (2), M' is a transitional metal element such as Mn, Co, Cr, Ni, Cu, and the like. the composition notation of Formula (2) is based on stoichiometric notation, and as stated above, as long as a perovskite structure can be achieved, naturally shifting of the composition by lattice mismatch, oxygen deficiency or the like, is allowable. For example, if the stoichiometric value is 1, a value in the range of 0.85 to 1.20 is allowable.

$$(Bi_{1-a}Ba_a)(Fe_{1-b-c}M'_cTi_b)O_3 \quad (2)$$

(where, $1<b/a$, preferably $1.17 \le b/a \le 1.45$, $2.3 \le (1-a)/a \le 4.0$, and $0<c<0.09$, preferably $0.01 \le c \le 0.05$)

Further, in cases where the piezoelectric layer 70 is manufactured using a method such as forming a first piezoelectric layer by a chemical solution method using a first precursor solution containing Bi, Ba, Fe and Ti, and forming a second piezoelectric layer on this first piezoelectric layer by a chemical solution method using a second precursor solution containing Li, B, or Cu in addition to Bi, Ba, Fe and Ti, the piezoelectric material of which the piezoelectric layer 70 is formed is basically a complex oxide having a perovskite structure containing Bi, Fe, Ba, and Ti, in which Bi and Ba are positioned in the A-site, and Fe and Ti are positioned in the B-site of the perovskite structure. This kind of complex oxide having a perovskite structure containing Bi, Fe, Ba, and Ti appears as a complex oxide having a bismuth ferrate and barium titanate mixed crystal perovskite structure, or as a solid solution in which the bismuth ferrate and barium titanate have homogeneously dissolved. Further, bismuth ferrate and barium titanate cannot be detected independently in an X-ray diffraction pattern. Here, bismuth ferrate and barium titanate are respectively well known piezoelectric materials having a perovskite structure, and a variety of compositions are known for each of them, for example, as bismuth ferrate and barium titanate, apart from $BiFeO_3$ and $BaTiO_3$, there are known examples with a partial deficiency or surplus of an element, or where a portion of an element has been replaced by another element, however, in the invention, in cases where bismuth ferrate and barium titanate are stated, as long as the basic properties have not changed, examples that deviate from the stoichiometric composition due to a deficiency or surplus, or examples where a portion of an element has been replaced by another element, are taken to be included in the range of bismuth ferrate and barium titanate. In cases such as this where piezoelectric layer is manufactured by a method as described above using a first precursor solution and a second precursor solution, in almost all cases, the complex oxide forming the piezoelectric layer 70 is a complex oxide having a perovskite structure of bismuth ferrate and barium titanate mixed crystal (for example, Formulas (3) and (4) below), containing a further small amount of Li, B, or Cu. Even if Li, B, or Cu is included, the piezoelectric layer 70 has a perovskite structure. It is presumed that the Li, B, or Cu replaces a portion of the A-site Bi, Ba, or B-site Fe, Ti, or exist at grain boundaries.

Formula (3) may be represented by Formula (3') and Formula (4) may be represented by Formula (4'). Here, the composition notation of Formula (3) and Formula (3') and the composition notation of Formula (4) and Formula (4') is based on stoichiometric notation, and as stated above, as long as a perovskite structure can be achieved, naturally unavoidable shifting of the composition by lattice mismatch, oxygen deficiency or the like, or replacement of a portion of the elements is allowable. For example, if the stoichiometric value is 1, a value in the range of 0.85 to 1.20 is allowable. Further, Formula (4) below is a case where the first precursor solution and second precursor solution have a further metallic complex containing Mn, Co or the like, in this case, it is presumed to be a complex oxide with a perovskite structure where Mn or Co are positioned on the B-site and Mn or Co replace a portion of the Fe positioned on the B-site.

$$(1-x)[BiFeO_3]-x[BaTiO_3] \quad (3)$$

(where, $0<x<0.40$)

(3')

(where, 0<x<0.40)

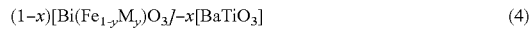
(4)

(where, 0<x<0.40, 0.01<y<0.09, M is either Mn or Co)

(4')

(where, 0<x<0.40, 0.01<y<0.09, M is either Mn or Co)

There is no particular limitation on the orientation of the piezoelectric layer 70 of the present embodiment, and it may be any of the planes (110), (100), or (111).

Lead electrode 90, which is made from gold (Au) or the like, is connected to each of the second electrodes 80 which are the individual electrodes of piezoelectric element 300, and which are drawn from the vicinity of the end portion of ink supply passage 14 and extend as far as over elastic film 50, and as required, over an insulating film.

Over flow passage forming plate 10 forming this kind of piezoelectric element 300, or in other words, over the first electrode 60, the elastic film 50, and as required, over an insulating film, and lead electrode 90, the protective plate 30 having a manifold portion 31 which forms at least a part of manifold 100, is connected via adhesive material 35. In the present embodiment, manifold portion 31 passes through protective plate 30 in the thickness direction, and is formed across the pressure generating chambers 12 in the width direction, and as described above communicates with the communicating portion 13 of the flow passage forming plate 10, and forms manifold 100, which is the common ink chamber of each of the pressure generating chambers 12. Further, the communicating portion 13 of the flow passage forming plate 10 may be divided into a plurality, one for each of the pressure generating chambers 12, with only manifold portion 31 serving as the manifold. Also, for example, only pressure generating chambers 12 are provided in flow passage forming plate 10, and the ink supply passage 14, which connects each of the pressure generating chambers 12 with the manifold 100, in the member (for example, the elastic film 50, and as required an insulating film and the like) between the flow passage forming plate 10 and the protective plate 30 is provided.

Also, a piezoelectric element holding portion 32 is provided in the region of protective plate 30 opposite the piezoelectric element 300, using a space that will not obstruct movement of the piezoelectric element 300. As long as the space used for the piezoelectric element holding portion 32 does not obstruct movement of the piezoelectric element 300, the space may be either sealed or not sealed.

For this kind of protective plate 30, it is preferable to use a material which has approximately the same coefficient of thermal expansion as the flow passage forming plate 10, for example, glass, ceramic material, or the like, and for the present embodiment, the protective plate 30 was formed from the same silicon monocrystal substrate as the flow passage forming plate 10.

Further, a through hole 33 is provided in protective plate 30 to pass through protective plate 30 in the thickness direction. Thus the vicinity of the end of the lead electrode 90, drawn from each of the piezoelectric elements 300, is provided so as to be exposed inside the through hole 33.

Driving circuit 120 is fixed on the protective plate 30 for the purpose of driving the piezoelectric element 300 provided in parallel. For this driving circuit 120, for example, a circuit substrate or a semiconductor integrated circuit (IC) may be used. The driving circuit 120 and the lead electrode 90 are electrically connected by connection wiring 121 which is made from conductive wire such as bonding wire or the like.

Also, a compliance substrate 40, configured by a sealing film 41 and a fixed plate 42, is connected to this kind of protective plate 30. The sealing film 41 is made from a flexible material having low stiffness, and the sealing film 41 seals one surface of the manifold portion 31. Also, the fixed plate 42 is formed from a relatively hard material. Since the region of the fixed plate 42 opposite the manifold 100 is an opening portion 43 which is completely removed in the thickness direction, one surface of the manifold 100 is sealed only by the flexible sealing film 41.

In an ink jet type recording head I of this kind of embodiment, ink is taken in from an ink inlet port connected to an external ink supply unit which are not illustrated, and after filling the inside from manifold 100 to nozzle opening 21 with ink, a voltage according to the recording signal from driving circuit 120 is applied between each of the first electrodes 60 and second electrodes 80 corresponding to the pressure generating chambers 12, and by deflection of the elastic film 50, the adhesive layer 56, the first electrode 60, and the piezoelectric layer 70, the pressure inside each of the pressure generating chambers 12 is increased and ink droplets are discharged from the nozzle openings 21.

Next, an example of the method of manufacturing an ink jet type recording head according to the current embodiment will be described with reference to FIGS. 4A to 8B. FIGS. 4A to 8B are cross sectional views of the pressure generating chamber in the longitudinal direction.

Figure 4A:
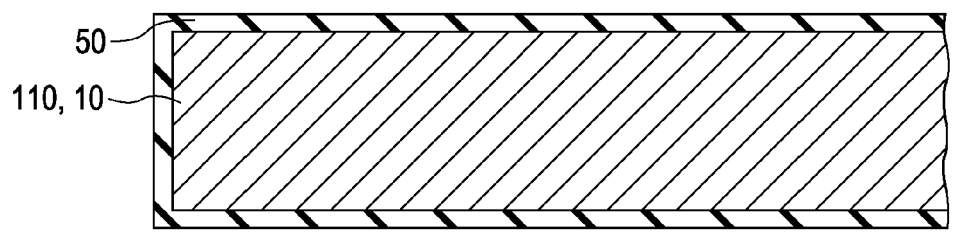
FIGS. 4A and 4B are cross sectional views illustrating the manufacturing process of a recording head according to Embodiment 1 of the invention.

Firstly, as shown in FIG. 4A, a silicon dioxide film made from silicon dioxide ($SiO_2$) or the like forming an elastic film 50 on the surface of wafer 110, which is a silicon wafer for the flow passage forming plate, is formed by thermal oxidation or the like. An insulating film (not shown) made from zirconium oxide or the like is formed on the elastic film 50 using, for example, a reactive sputtering method or thermal oxidation or the like.

Figure 4B:
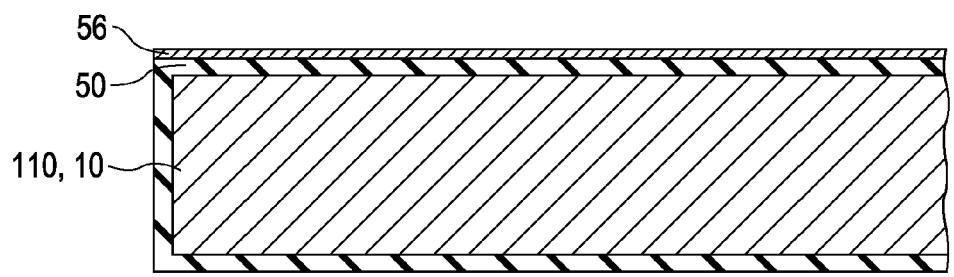

Next, as shown in FIG. 4B, an adhesive layer 56 made from titanium oxide or the like, is formed on elastic film 50 (zirconium oxide film), or in cases where an insulating film has been provided, on the insulating film, using a sputtering method or thermal oxidation or the like.

Figure 5A:
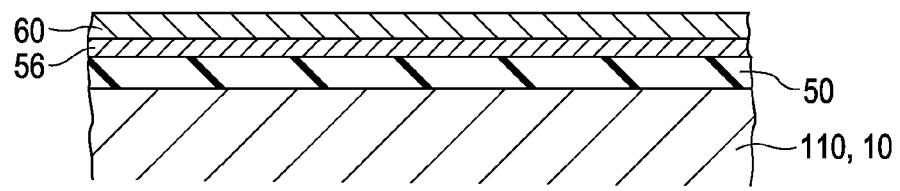
FIGS. 5A to 5C are cross sectional views illustrating the manufacturing process of a recording head according to Embodiment 1 of the invention.
Figure 5B:
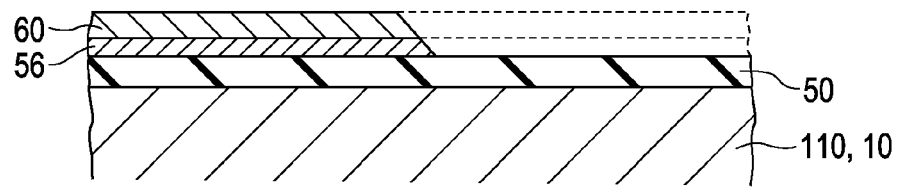

Next, as shown in FIG. 5A, the first electrode 60 which is made from platinum, iridium, iridium oxide or a laminated structure of the above or the like, is formed over the entire surface of adhesive layer 56 using a sputtering method or vacuum deposition or the like. Next, as shown in FIG. 5B, a resist of a predetermined shape (not shown) is applied as a mask on the first electrode 60, and the adhesive layer 56 and the first electrode 60 are concurrently patterned so as to provide an inclined side surface.

Subsequently, after the resist has been peeled off, the piezoelectric layer 70 is laminated on the first electrode 60 so that the manufactured piezoelectric layer 70 will have a residual stress of 250 MPa or more, preferably of more than or equal to 250 MPa and less than or equal to 350 MPa. As long as the piezoelectric layer 70 can be manufactured with a residual stress of 250 MPa or more, the method of manufacturing piezoelectric layer 70 is not limited, for example, Metal-Organic Decomposition (MOD) in which a coating of a solution containing a metallic complex is applied and allowed to dry, then a piezoelectric layer (piezoelectric film) made from metallic oxide is obtained by firing at a high temperature, or a chemical solution method such as the sol-gel method may be used to manufacture the piezoelectric layer 70. In addition, the piezoelectric layer 70 may be manufactured using laser abrasion, sputtering, pulse laser deposition (PLD), CVD, aerosol deposition or the like, gas phase method, liquid phase method, or solid phase method.

Figure 5C:
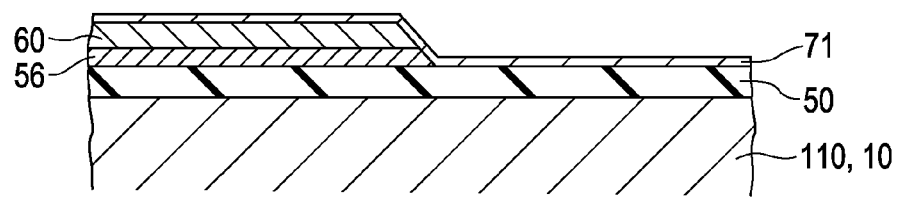

As a specific example of a procedure for forming the piezoelectric layer 70 by a chemical solution method, firstly, as shown in FIG. 5C, a coating of a composition (precursor solution) for forming a piezoelectric film made from a MOD solution or colloidal suspension containing a metallic complex containing for example, Bi, Fe, Ba, or Ti, is applied on the first electrode 60 using spin coating or the like, to form a piezoelectric precursor film 71 (coating process).

As the precursor solution for the coating, a metallic complex from which complex oxides that constitute piezoelectric layer 70 can be obtained by firing, which according to the present embodiment is a metallic complex from which complex oxides containing Bi, Fe, Ba, and Ti can be obtained by firing, are mixed, and the mixture is dissolved or dispersed in organic solvent. Also, in cases where piezoelectric layer 70 is formed from complex oxides containing Mn, Co, or Cr, a precursor solution containing a metal complex having Mn, Co, and Cr is used. The mixing ratio for each of the metallic complexes may be mixed to give the desired molar ratio for each of the metals, specifically, for example, the molar ratio of Ti and Ba (Ti/Ba) may be more than 1, and is preferably mixed to give a complex oxide with a molar ratio of Bi and Ba (Bi/Ba) of more than or equal to 2.3 and less than or equal to 4.0. As a metallic complex, for each of the metals, for example, an alkoxide, organic salt, or a beta-diketone complex may be used. As a metallic complex which contains Bi, for example, there is bismuth 2-ethylhexanoate, or bismuth acetate or the like. As a metallic complex which contains Fe, for example, there is iron 2-ethylhexanoate, iron acetate, tris (acetylacetonate) iron or the like. As a metallic complex which contains Ba, for example, there is barium isopropoxide, barium 2-ethylhexanoate, and barium acetylacetonate or the like. As a metallic complex which contains Ti, for example, there is titanium isopropoxide, 2-ethylhexanoic acid titanium, titanium(di-1-propoxide) bis(acetylacetonate) or the like. As a metallic complex which contains Mn, for example, there is manganese bis(2-ethylhexanoate) and manganese acetate. As an organometallic complex which contains Co, for example, there is cobalt octoate and cobaltic acetylacetonate. As an organometallic compound which contains Cr, for example, there is chromium (III) 2-ethylhexanoate. Of course, as the metallic complex contained in the precursor solution, a metallic complex containing one type of metal such as Bi, Fe, Ba or Ti may be used, or a metallic complex containing two or more types of metal may be used. Further, as solvents for the precursor solution, examples are propanol, butanol, pentanol, hexanol, octanol, ethylene glycol, propylene glycol, octane, decane, cyclohexane, xylene, toluene, tetrahydrofuran, acetic acid, octanoic acid and the like.

Next, this piezoelectric precursor film 71 is heated to a predetermined temperature (for example, 130° C. to 200° C.) and dried for a set time (drying process). Then, the dried piezoelectric precursor film 71 is heated to a predetermined temperature (for example, 350° C. to 450° C.) and kept at that temperature for a set time to remove grease (degreasing process). The degreasing referred to here means the removal of organic compounds such as $NO_2$, $CO_2$, $H_2O$ and the like, that are contained in the piezoelectric precursor film 71. The atmosphere for the drying process and the degreasing process is not limited, and it may be the air, an oxygen atmosphere, or an inert gas atmosphere. The coating process, the drying process and the degreasing process may be performed a plurality of times.

Figure 6A:
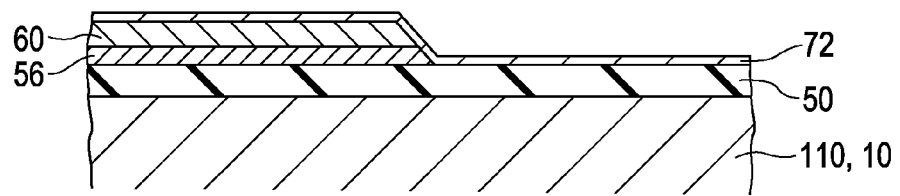
FIGS. 6A and 6B are a cross sectional views illustrating the manufacturing process of a recording head according to Embodiment 1 of the invention.

Next, as shown in FIG. 6A, the piezoelectric precursor film 71 is heated to a predetermined temperature, for example, 600° C. to 900° C., and kept at that temperature for a set time, for example, 1 to 10 minutes, to crystallize, and to form a complex oxide having a perovskite structure containing Bi, Ba, Fe, and Ti (firing process). The atmosphere for the firing process is not limited, and it may be the air, an oxygen atmosphere, or an inert gas atmosphere. Examples of a heating device used for the drying process, degreasing process, and firing process are an Rapid Thermal Annealing (RTA) device, in which heating is achieved using an infrared lamp, or a hot plate and the like.

Figure 6B:
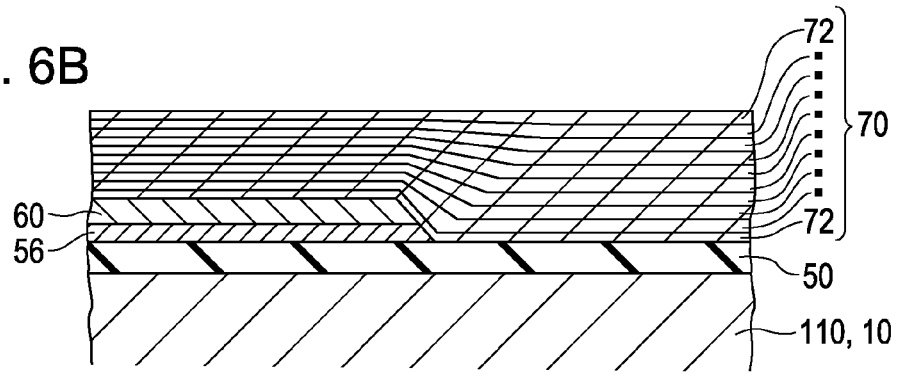

Next, the above mentioned coating process, drying process, and degreasing process, or the coating process, drying process, degreasing process, and firing process are repeated a plurality of times in accordance with the desired film thickness, to form a plurality of piezoelectric films 72. As shown in FIG. 6B, the piezoelectric layer 70 of a predetermined thickness is formed from a plurality of piezoelectric films 72, and the piezoelectric layer 70 of the invention is formed and which has a residual stress of equal to or more than 250 MPa. When forming the plurality of piezoelectric films 72, the coating process, drying process, degreasing process, and firing process may be performed in sequence to laminate, or a plurality of layers may be fired together after repeating the coating process, drying process, and degreasing process. Also, the piezoelectric film 72 according to the present embodiment is provided by laminating, however it may be provided as a single layer.

When manufacturing the piezoelectric layer 70 in this way, the residual stress of the piezoelectric layer 70 formed by the firing process above, can be adjusted by adjusting: the ratio and kinds of elements used for the precursor solutions, the composition ratio of the metallic elements that form the piezoelectric layer 70, for example, Ti/Ba which is the molar ratio of Ti and Ba and the like, manufacturing of the piezoelectric layer 70 using two or more kinds of precursor solution, the firing conditions of the firing process of the piezoelectric layer 70 such as the firing temperature and the like, the material and thickness of the substrate and the elastic film 50, the insulating film, the sealing film 56, and the lower electrode 60 which are formed on the substrate, and the orientation of the piezoelectric layer 70. Since the residual stress of the piezoelectric layer 70 formed by the firing process will change according to the ratio and kinds of elements used for the precursor solutions, manufacturing of the piezoelectric layer 70 using two or more kinds of precursor solution, the firing conditions of the firing process of the piezoelectric layer 70 such as the firing temperature, the material and thickness of the substrate and the elastic film 50, the insulating film, the sealing film 56, and the lower electrode 60 which are formed on the substrate, and the orientation of the piezoelectric layer 70, it is necessary to adjust the balance of each of these conditions. In any case, the residual stress in the piezoelectric layer 70 is made 250 MPa or more, and by performing the latter processes, an ink jet type recording head with an improved strain amount can finally be manufactured. Since the strain characteristics of the finally manufactured ink jet type recording head and the like, can be judged from the residual stress at the stage where the piezoelectric layer 70 has been manufactured, which is an intermediate stage of the manufacturing of the ink jet type recording head and the like, it is possible to increase the yield.

A method of manufacturing the piezoelectric layer 70 using two or more precursor solutions will be described below. Firstly, after forming a first piezoelectric precursor film using a first precursor solution containing a metallic complex which contains Bi, Fe, Ba, and Ti, on the first electrode 60, this first piezoelectric precursor film is crystallized by heating to form a first piezoelectric layer. As a specific example of the formation procedure of this kind of first piezoelectric layer, firstly, a coating of the first precursor solution containing Bi, Fe, Ba, and Ti, is applied on the first electrode 60 by spin coating or the like, to form the first piezoelectric precursor film (first piezoelectric layer coating process).

The first precursor solution to be coated is obtained such that a metallic complex containing Bi, Fe, Ba, and Ti is mixed, and the mixture is dissolved or dispersed in organic solvent. A first precursor solution containing a metallic complex further having Mn, Co or the like may be used. The mixing ratio for each of the metallic complexes may be mixed to give the desired molar ratio for each of the metals. As a metallic complex, for each of the metals, for example, an alkoxide, organic salt, or a beta-diketone complex may be used. As a metallic complex which contains Bi, for example, there is bismuth 2-ethylhexanoate, or bismuth acetate or the like. As a metallic complex which contains Fe, for example, there is iron 2-ethylhexanoate, iron acetate, tris(acetylacetonate) iron or the like. As a metallic complex which contains Ba, for example, there is barium isopropoxide, barium 2-ethylhexanoate, and barium acetylacetonate or the like. As a metallic complex which contains Ti, for example, there is titanium isopropoxide, 2-ethylhexanoic acid titanium, titanium(di-1-propoxide) bis(acetylacetonate) or the like. As a metallic complex which contains Mn, for example, there is manganese bis(2-ethylhexanoate) and manganese acetate. As an organometallic compound which contains Co, for example, there is cobalt octoate and cobaltic acetylacetonate. Of course, as the metallic complex contained in the precursor solution, a metallic complex containing one type of metal such as Bi, Fe, Ba or Ti may be used, or a metallic complex containing two or more types of metal may be used. Further, as solvents for the first precursor solution, examples are propanol, butanol, pentanol, hexanol, octanol, ethylene glycol, propylene glycol, octane, decane, cyclohexane, xylene, toluene, tetrahydrofuran, acetic acid, octanoic acid and the like.

Then, this first piezoelectric precursor film is heated to a predetermined temperature (for example, 130° C. to 200° C.) and dried for a set time (first piezoelectric layer drying process). Next, the dried first piezoelectric precursor film is heated to a predetermined temperature (for example, 350° C. to 450° C.) and kept at that temperature for a set time to remove grease (first piezoelectric layer degreasing process). The degreasing referred to here means the removal of organic compounds such as $NO_2$, $CO_2$, $H_2O$ and the like, that are contained in the first piezoelectric precursor film. The atmosphere for the drying process and the degreasing process is not limited, and it may be the air, an oxygen atmosphere, or an inert gas atmosphere. The first piezoelectric layer coating process, the first piezoelectric layer drying process and the first piezoelectric layer degreasing process may each be performed once respectively, or the first piezoelectric layer coating process, the first piezoelectric layer drying process and the first piezoelectric layer degreasing process may be performed a plurality of times.

Next, the first piezoelectric precursor film is heated to a predetermined temperature (for example, 600° C. to 900° C.) and kept at that temperature for a set time, for example, 1 to 10 minutes, to crystallize, and to form the first piezoelectric film which is a complex oxide having a perovskite structure containing Bi, Fe, Ba, and Ti (first piezoelectric layer firing process). For example, if the process of providing a plurality of first piezoelectric precursor films and firing them together is repeated a plurality of times, a first piezoelectric layer made from a plurality of first piezoelectric films is formed. The atmosphere for the first piezoelectric layer firing process is not limited, and it may be the air, an oxygen atmosphere, or an inert gas atmosphere. Examples of a heating device which may be used for the first piezoelectric layer drying process, first piezoelectric layer degreasing process, and first piezoelectric layer firing process are an RTA device, or a hot plate and the like. Also, when forming the first piezoelectric layer from a plurality of first piezoelectric films, as described above, after repeatedly performing the first piezoelectric layer coating process, first piezoelectric layer drying process, and first piezoelectric layer degreasing process, the plurality of layers may be fired together, or the first piezoelectric layer coating process, first piezoelectric layer drying process, first piezoelectric layer degreasing process, and first piezoelectric layer firing process may be performed in sequence to laminate. Also, the first piezoelectric film may be provided by laminating, or it may be provided as a single layer.

Next, a second piezoelectric precursor film is formed on the first piezoelectric layer by using a second precursor solution containing, in addition to the metallic complex containing Bi, Fe, Ba, and Ti, contained in the first precursor solution, a metallic complex containing at least one of Li, B, and Cu. As a specific example of the formation procedure of the second piezoelectric precursor film, firstly, a coating of the second precursor solution is applied on the first piezoelectric layer by spin coating or the like, to form the second piezoelectric precursor film (second piezoelectric layer coating process).

The second precursor solution to be coated is obtained such that a metallic complex containing, in addition to Bi, Fe, Ba, and Ti, at least one of Li, B, and Cu is mixed, and the mixture is dissolved or dispersed in organic solvent. A second precursor solution containing a metallic complex further having Mn, Co or the like may be used. For example, the second precursor solution may be obtained such that a metallic complex containing at least one of Li, B, and Cu is further added to the first precursor solution. The mixing ratio for each of the metallic complexes may be mixed to give the desired molar ratio for each of the metals. For example, with respect to the total molar quantity of A-site elements such as Bi, Ba, and the like and the total molar quantity of B-site elements such as Fe, Ti, Mn, and the like, Li is preferably 1.0 mol % to 10 mol %, B is preferably 1.0 mol % to 10 mol %, and Cu is preferably 0.5 mol % to 10 mol %. As a metallic complex, for each of the metals, for example, an alkoxide, organic salt, or a beta-diketone complex may be used. As a metallic complex which contains Bi, for example, there is bismuth 2-ethylhexanoate, bismuth acetate or the like. As a metallic complex which contains Fe, for example, there is iron 2-ethylhexanoate, iron acetate, tris(acetylacetonate) iron or the like. As a metallic complex which contains Ba, for example, there is barium isopropoxide, barium 2-ethylhexanoate, and barium acetylacetonate or the like. As a metallic complex which contains Ti, for example, there is titanium isopropoxide, 2-ethylhexanoic acid titanium, titanium(di-1-propoxide) bis(acetylacetonate) or the like. As a metallic complex which contains Mn, for example, there is manganese bis(2-ethylhexanoate) and manganese acetate. As an organometallic compound which contains Co, for example, there is cobalt octoate and cobaltic acetylacetonate. As a metallic complex which contains Li, for example, there is lithium 2-ethylhexanoate. As a metallic complex which contains B, for example, there is boron 2-ethylhexanoate. As a metallic complex which contains Cu, for example, there is copper bis(2-ethylhexanoate). Of course, as the metallic complex contained in the precursor solution, a metallic complex containing one type of metal such as Bi, Fe, Ba, Ti, Li, B or Cu may be used, or a metallic complex containing two or more types of metal may be used. Further, as solvents for the second precursor solution, examples are propanol, butanol, pentanol, hexanol, octanol, ethylene glycol, propylene glycol, octane, decane, cyclohexane, xylene, toluene, tetrahydrofuran, acetic acid, octanoic acid and the like.

Then, this second piezoelectric precursor film is heated to a predetermined temperature (for example, 150° C. to 200° C.) and dried for a set time (second piezoelectric layer drying process). Next, the dried second piezoelectric precursor film is heated to a predetermined temperature (for example, 350° C. to 450° C.) and kept at that temperature for a set time to remove grease (second piezoelectric layer degreasing process). The degreasing referred to here means the like, that are contained in the second piezoelectric precursor film. The atmosphere for the second piezoelectric layer drying process and the second piezoelectric layer degreasing process is not limited, and it may be the air, an oxygen atmosphere, or an inert gas atmosphere. The second piezoelectric layer coating process, the second piezoelectric layer drying process and the second piezoelectric layer degreasing process may each be performed once respectively, or the second piezoelectric layer coating process, the second piezoelectric layer drying process and the second piezoelectric layer degreasing process may be performed a plurality of times.

Next, the second piezoelectric precursor film is heated to a predetermined temperature, for example, 600° C. to 900° C., and kept at that temperature for a set time, for example, 1 to 10 minutes, to crystallize, and to form the second piezoelectric film which is a complex oxide having a perovskite structure (second piezoelectric layer firing process). For example, if a plurality of second piezoelectric precursor films is provided, a second piezoelectric layer made from a plurality of second piezoelectric films is formed.

The atmosphere for the second piezoelectric layer firing process is not limited, and it may be the air, an oxygen atmosphere, or an inert gas atmosphere. Examples of a heating device which may be used for the second piezoelectric layer drying process, second piezoelectric layer degreasing process, and second piezoelectric layer firing process are an RTA device, a hot plate or the like. Also, when forming the second piezoelectric layer from a plurality of second piezoelectric films, after repeatedly performing the second piezoelectric layer coating process, second piezoelectric layer drying process, and second piezoelectric layer degreasing process, the plurality of layers may be fired together, or the second piezoelectric layer coating process, second piezoelectric layer drying process, second piezoelectric layer degreasing process, and second piezoelectric layer firing process may be performed in sequence to laminate. Also, the second piezoelectric film may be provided by laminating, or it may be provided as a single layer.

In the second piezoelectric precursor film heating and crystallization process (second piezoelectric layer firing process), the first piezoelectric film, which is the layer below the second piezoelectric precursor film, is also heated. When the first piezoelectric film is heated in this way concurrently with the heating of the second piezoelectric precursor film, which is formed above the first piezoelectric film, when the first piezoelectric film enters the liquid phase, Li, B and Cu, which are the elements constituting the second piezoelectric precursor film, disperse as far as the first piezoelectric film which has entered the liquid phase, and then it can be presumed that the first piezoelectric film, which has become liquid phase, and the second piezoelectric precursor film crystallize as a whole. In this way, when the second piezoelectric precursor film is heated and crystallizes, the first piezoelectric film enters liquid phase, and since the metal elements contained in the first precursor solution and the metal elements contained in the second precursor solution are shared, the piezoelectric layer 70 obtained by successive crystal growth forms a single layer piezoelectric layer in which the boundary cannot be observed.

Figure 7A:
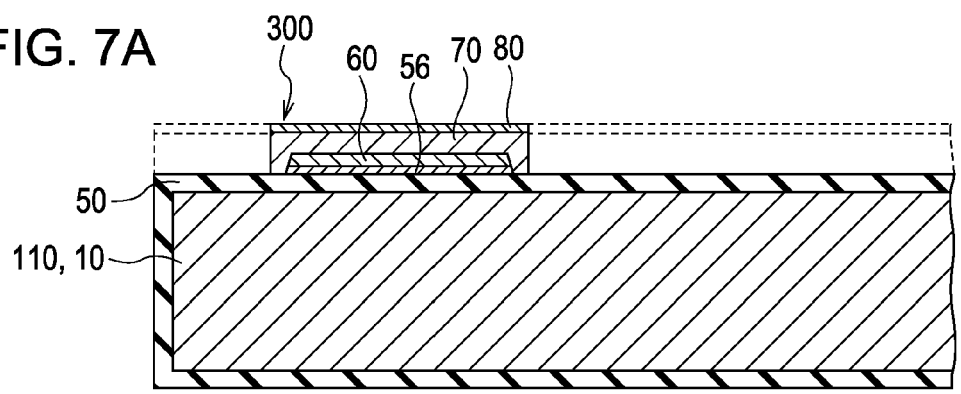
FIGS. 7A to 7C are cross sectional views illustrating the manufacturing process of a recording head according to Embodiment 1 of the invention.

After forming piezoelectric layer 70 in this way, as shown in FIG. 7A, the second electrode 80, which is made from platinum or the like, is formed on piezoelectric layer 70 by sputtering or the like, piezoelectric layer 70 and the second electrode 80 in the region opposite each of the pressure generating chambers 12 are concurrently patterned, and the piezoelectric element 300, having the first electrode 60, the piezoelectric layer 70, and the second electrode 80 is thereby formed. The patterning of the piezoelectric layer 70 and the second electrode 80 may be performed together by dry etching through a resist of a predetermined shape (not shown). After that, if required, a post anneal may be performed in the temperature range of 600° C. to 800° C. By doing this, a good boundary can be formed between piezoelectric layer 70, and the first electrode 60 and the second electrode 80, and also the crystalline properties of the piezoelectric layer 70 can be improved.

Figure 7B:
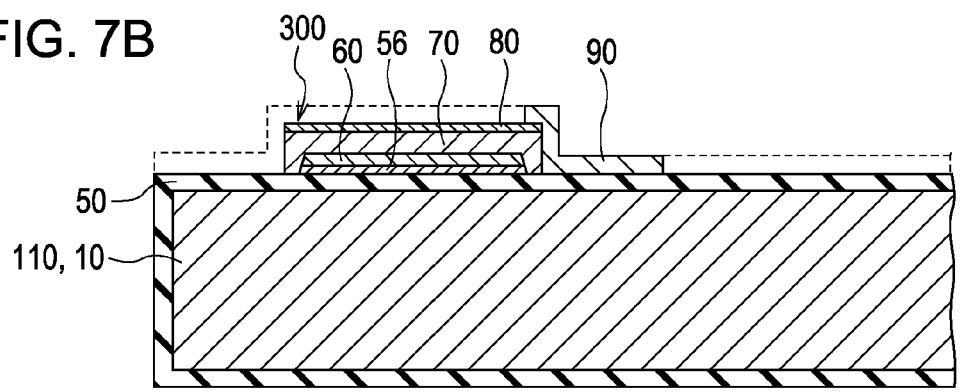

Next, as shown in FIG. 7B, after forming lead electrode 90, made from, for example, gold (Au), each of the piezoelectric elements 300 is formed by patterning through a mask pattern (not shown) made from resist or the like, over the entire surface of a flow passage forming plate use wafer 110.

Figure 7C:
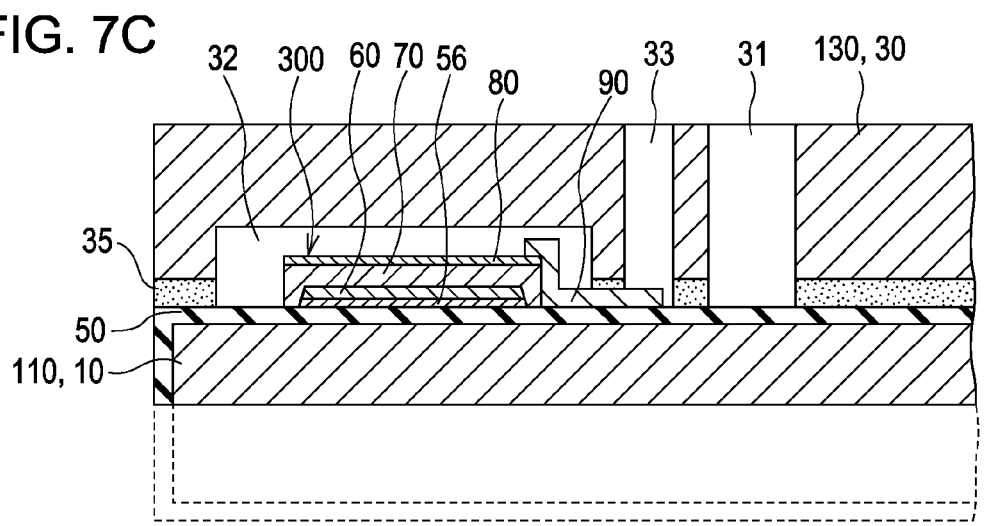

Next, as shown in FIG. 7C, after a protective plate use wafer 130, which is a silicon wafer, and which will form a plurality of protective plates 30, is joined to the piezoelectric element 300 side of the flow passage forming plate use wafer 110 using adhesive 35, the flow passage forming plate use wafer 110 is thinned to a predetermined thickness.

Figure 8A:
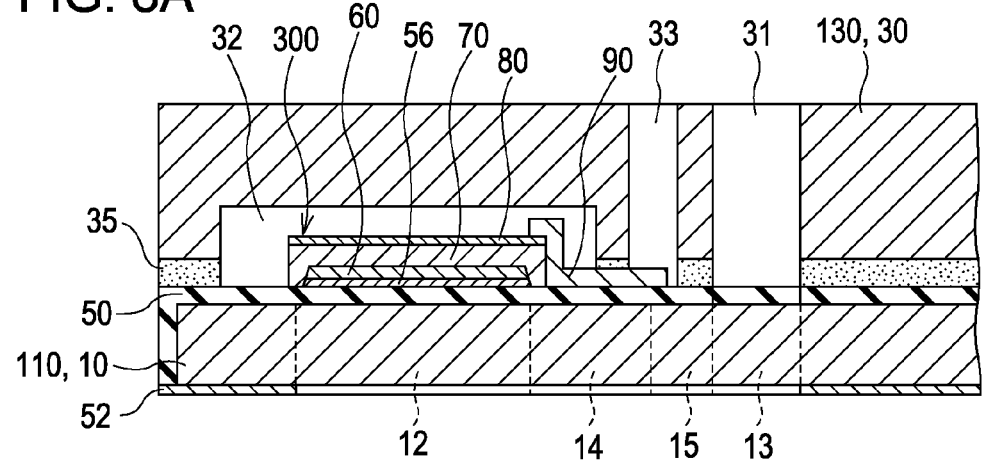
FIGS. 8A and 8B are cross sectional views illustrating the manufacturing process of a recording head according to Embodiment 1 of the invention.

Next, as shown in FIG. 8A, a mask film 52 is newly formed on flow passage forming plate use wafer 110, and patterned to a predetermined shape.

Figure 8B:
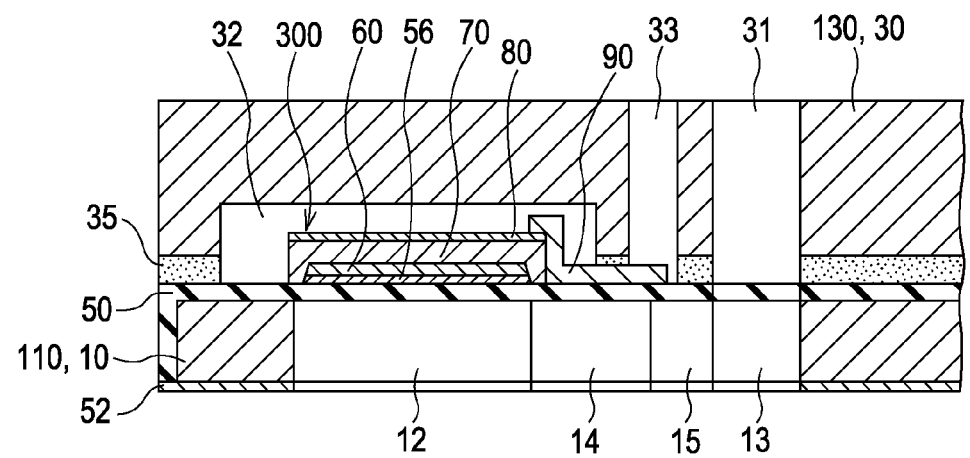

Then, as shown in FIG. 8B, by anisotropic etching (wet etching) of the flow passage forming plate use wafer 110 using an alkaline solution such as KOH or the like, through mask film 52, the pressure generating chamber 12, the communicating portion 13, ink supply passage 14, and communicating passage 15 are formed corresponding to piezoelectric element 300.

Next, the unwanted outer periphery portion of the flow passage forming plate use wafer 110 and the protective plate use wafer 130 is removed by, for example, using dicing or the like to cut them off. After removing the mask film on the surface of the flow passage forming plate use wafer 110 opposite the protective plate use wafer 130, while joining the nozzle plate 20, into which nozzle openings 21 have been drilled, the compliance substrate 40 is joined to the protective plate use wafer 130, and the ink jet type recording head I of the invention is made by dividing the flow passage forming plate use wafer 110 into chip-sized flow passage forming plate 10 and the like as shown in FIG. 1.

EXAMPLES

An embodiment and the invention are described in more detail below. The invention is not limited to the embodiment given below.

Example 1

Firstly, silicon dioxide film with a film thickness of 1130 nm was formed on the surface of a silicon monocrystal substrate, the orientation of which is the plane (110), using oxidation. Next, a titanium film having a film thickness of 20 nm was formed on the silicon dioxide film using DC sputtering, and a titanium oxide film was formed by performing thermal oxidation. Next, a platinum film having a film thickness of 130 nm was formed as the first electrode 60 on the oxidized silicon film using DC sputtering.

Then, the piezoelectric layer 70 made from a complex oxide having a perovskite structure containing Bi, Ba, Fe, Mn, and Ti was formed on the first electrode 60. The method is as follows. Firstly, a precursor solution was prepared by mixing n-octane solutions of bismuth 2-ethylhexanoate, barium 2-ethylhexanoate, iron 2-ethylhexanoate, manganese bis(2-ethylhexanoate), and 2-ethylhexanoic acid titanium to give a molar ratio of Bi:Ba:Fe:Mn:Ti=0.75:0.25:0.7125:0.0375:0.25.

Next, this precursor solution was dripped onto the substrate on which were formed the silicon dioxide film, titanium oxide film, and the first electrode 60, and after rotating for 5 seconds at 500 rpm, the substrate was rotated for 20 seconds at 3000 rpm and a piezoelectric precursor film was formed by spin coating (coating process). Next, the substrate was placed on a hot plate and dried for 3 minutes at 180° C. (drying process). Then the substrate was placed on a hot plate for 3 minutes at 350° C. to perform degreasing (degreasing process). After repeating the procedure consisting of the coating process, the drying process, and the degreasing process 3 times, firing was performed for 5 minutes in an oxygen atmosphere at 800° C. in a Rapid Thermal Annealing (RTA) device, (firing process). The above processes were repeated four times for a total of 12 coatings in order to form a piezoelectric layer 70 having an overall thickness of 1000 nm.

After that, the piezoelectric element 300 was formed by forming an iridium film as the second electrode 80 with a film thickness of 50 nm on piezoelectric layer 70 using DC sputtering.

Example 2

The same operations were performed as for Example 1 except that a firing temperature of 750° C. was used in the firing process.

Example 3

The same operations were performed as for Example 1 except that the precursor solution was prepared by mixing n-octane solutions of bismuth 2-ethylhexanoate, barium 2-ethylhexanoate, iron 2-ethylhexanoate, manganese bis(2-ethylhexanoate), and 2-ethylhexanoic acid titanium to give a molar ratio of Bi:Ba:Fe:Mn:Ti=0.75:0.25:0.6375:0.0375:0.325.

Example 4

The method for forming the piezoelectric element 70 on the first electrode 60 is described below. The same operations were performed as for Example 1 except that the method of forming the piezoelectric layer 70 made from a complex oxide having a perovskite structure containing Bi, Ba, Fe, Mn, and Ti was the method described below. Firstly, a first precursor solution was prepared by mixing n-octane solutions of bismuth 2-ethylhexanoate, barium 2-ethylhexanoate, iron 2-ethylhexanoate, manganese bis(2-ethylhexanoate), and 2-ethylhexanoic acid titanium to give a molar ratio of Bi:Ba:Fe:Mn:Ti=0.75:0.25:0.7125:0.0375:0.25.

Next, the first precursor solution was dripped onto the first electrode 60, and after rotating for 6 seconds at 500 rpm, the substrate was rotated for 20 seconds at 3000 rpm and a first piezoelectric precursor film was formed by spin coating (first piezoelectric layer coating process). Next, the substrate was placed on a hot plate and dried for minutes at 180° C. (first piezoelectric layer drying process). Then the substrate was placed on a hot plate for minutes at 350° C. to perform degreasing (first piezoelectric layer degreasing process). After repeating the procedure consisting of the first piezoelectric layer coating process, the first piezoelectric layer drying process, and the first piezoelectric layer degreasing process 3 times, firing was performed for 5 minutes in an oxygen atmosphere at 800° C. in a Rapid Thermal Annealing (RTA) device, (first piezoelectric layer firing process). The above processes were repeated three times for a total of 9 coatings in order to form a first piezoelectric layer 70 having an overall thickness of 800 nm.

Next, a second precursor solution was prepared by mixing n-octane solutions of bismuth 2-ethylhexanoate, barium 2-ethylhexanoate, iron 2-ethylhexanoate, manganese bis(2-ethylhexanoate), 2-ethylhexanoic acid titanium, and lithium 2-ethylhexanoate to give a molar ratio of Bi:Ba:Fe:Mn:Ti:Li=0.75:0.25:0.7125:0.0375:0.25:0.03.

Next, this second precursor solution was dripped onto the first piezoelectric layer and after rotating for 6 seconds at 500 rpm, the substrate was rotated for 20 seconds at 3000 rpm and a second piezoelectric precursor film was formed by spin coating (second piezoelectric layer coating process). Next, the substrate was placed on a hot plate and dried for 3 minutes at 180° C. (second piezoelectric layer drying process). Then the substrate was placed on a hot plate for 3 minutes at 350° C. to perform degreasing (second piezoelectric layer degreasing process). After repeating the procedure consisting of the second piezoelectric layer coating process, the second piezoelectric layer drying process, and the second piezoelectric layer degreasing process 3 times, firing was performed for 5 minutes in an oxygen atmosphere at 750° C. in an RTA device, (second piezoelectric layer firing process). The thickness of the second piezoelectric layer formed by the second precursor solution in this way was 300 nm. By the above processes, the piezoelectric layer 70 was formed from the first piezoelectric layer and the second piezoelectric layer.

Comparative Example 1

The same operations were performed as for Example 1 except that the firing temperature of the firing process was made 650° C.

Test Example 1

With regard to Examples 1 to 4 and Comparative Example 1, before forming the piezoelectric layer 70, the curvature W1 of the silicon monocrystal substrate on which the silicon oxide film, titanium oxide film, and the first electrode 60 were formed, and after forming the piezoelectric layer 70, the curvature W2 of the silicon monocrystal substrate before forming the second electrode 80, were measured using a stress measuring machine (made by KLA-Tencor). Then, the residual stress σ of the piezoelectric layer 70, before forming the second electrode 80, was determined from the difference in curvature ΔW using the equations below derived from Stoney's formula. The results are shown in Table 1. The residual stress σ in all the Examples 1 to 4 and in the Comparative Example 1 were all tensile stresses.

$$\text{residual stress } \sigma = (4 \cdot E_S \cdot T_S^2 \cdot \Delta W)/[3 \cdot l^2 \cdot (1-\upsilon_s) \cdot t_f]$$

where, $E_S$: Young's modulus of the silicon monocrystal substrate=130 GPa $T_S$: thickness of the silicon monocrystal substrate=625 μm
ΔW: W1-W2
l: scan length (region over which curvature is measured)=110 nm
$\upsilon_s$: Poisson's ratio of the silicon monocrystal substrate=0.28
$t_f$: thickness of the piezoelectric layer 70 (nm)

Young's modulus was measured using a nano indenter (UMIS 2000 made by CSIRO) under the following conditions:

Spherical indenter: 1 μm diameter LA
Initial contact load: 0.03 mN
Maximum load: 0.5 mN
Load/unload increments: 20 (linear)
Unloading to: 70% of maximum
Enable unload on increments: unload increments 1
Dwell: 1 second
Indent delay: 30 seconds Test Example 2

Figure 9:
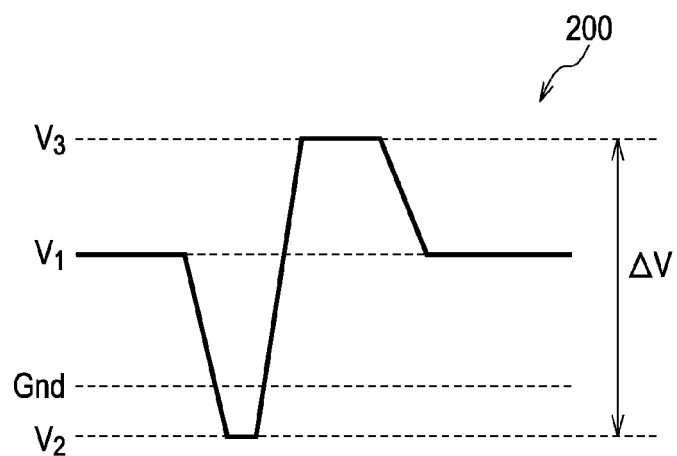
FIG. 9 is a diagram illustrating a driving waveform used in test example 2.

In Examples 1 to 4 and Comparative Example 1, the pressure generating chamber 12 corresponding to piezoelectric element 300 was formed by anisotropic etching (wet etching) on the side of the silicon monocrystal substrate opposite the side on which the piezoelectric element 300 was provided, using a KOH solution through a mask film. The width of the pressure generating chamber 12 was made 57.5 μm. Then, for each of the piezoelectric elements, with the first electrode 60 set as the standard electrical potential (referred to as "Gnd" in FIG. 9), the displacement when the driving waveform 200 shown in FIG. 9 was applied to the second electrode 80, was determined. The resonant frequency (Fa) of the piezoelectric element at the time when the driving waveform 200 was applied, was 2.5 MHz. The displacement was measured using a laser doppler displacement meter made by Graftek Imaging Inc., at room temperature (25° C.). In the driving waveform 200 shown in FIG. 9, the side above the standard electrical potential (Gnd) is positive potential, and the side below standard electrical potential (Gnd) is negative potential. Also, $V_1$ is the voltage applied in standby state (intermediate voltage). For this Test Example, $V_1$=17.5 V, $V_2$=−5 V, and $V_3$=45 V. The results are shown in Table 1. The results, as shown in Table 1, show that the residual stress generated at the stage when the piezoelectric layer 70 was formed was 250 MPa or more for Examples 1 to 4, and was significantly higher than the stress when compared with Comparative Example 1.

TABLE 1

|  | Residual stress measuring results for Test Example 1 (MPa) | Displacement (nm) |
| --- | --- | --- |
| Example 1 | 300 | 230 |
| Example 2 | 250 | 215 |
| Example 3 | 350 | 230 |
| Example 4 | 320 | 250 |
| Comparative example 1 | 200 | 180 |

Test Example 3

With regard to the piezoelectric element of Examples 1 to 4 and the Comparative Example 1, the X-ray diffraction pattern of the piezoelectric layer 70 was determined at room temperature (25° C.) using a "D8 Discover" made by Bruker AXS Inc., and using a CuK-alpha radiation X-ray source. In all of the embodiments 1 to 4 and the Comparative Example 1, the peak caused by the perovskite structure, and the peak caused by the substrate were observed, and no irregularities were confirmed. The orientation of piezoelectric layer 70 was plane (110).

Other Embodiments

An embodiment of the invention was described above, however, the basic structure of the invention is not limited to the one described above. For example, the flow passage forming plate 10 of the embodiment described above was exemplified by a silicon monocrystal substrate, but is not limited to that, and for example, materials such as SOI substrate, or glass and the like could also be used.

Figure 10:
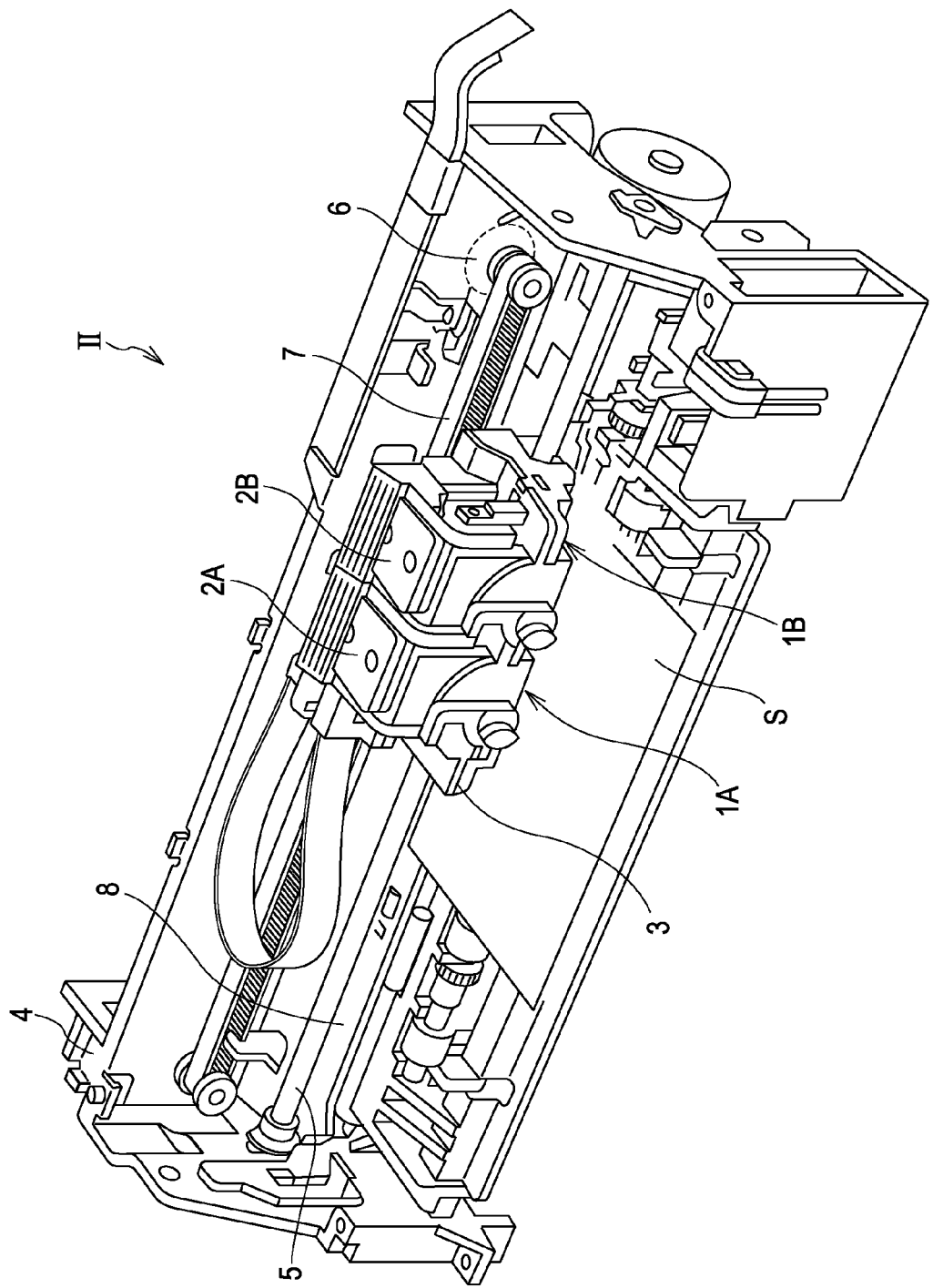
FIG. 10 is a view showing the overall structure of a recording apparatus according to an embodiment of the invention.

Further, the ink jet type head of these embodiments forms a part of a recording head unit provided with an ink passage which communicates with an ink cartridge or the like, and which is mounted in an ink jet type recording apparatus. FIG. 10 is a schematic view showing an example of such an ink jet type recording apparatus.

In the ink jet type recording apparatus II shown in FIG. 10, recording head units 1A and 1B which use the ink jet type recording head I are provided with attachable and detachable cartridges 2A and 2B which constitute an ink supply unit. A carriage 3, on which these recording head units 1A and 1B are mounted, is provided on a carriage shaft 5, which is attached to an apparatus body 4, so as to move in the shaft direction. These recording head units 1A and 1B are, for example, provided to discharge a black ink composition and a color ink composition respectively.

By transmitting the driving force of a driving motor 6 to the carriage 3 through a plurality of gears, which are not shown, and a timing belt 7, the carriage 3, on which these recording head units 1A and 1B are mounted, is made to move along carriage shaft 5. Meanwhile, inside the apparatus body 4, a platen 8 is provided alongside the carriage shaft 5, and a recording sheet S, which is a recording medium which is paper or the like supplied by a paper supply roller and the like which are not shown, is transported so as to be rolled to lay on the platen 8.

As an example of a liquid discharge head of the above embodiment, an ink jet type recording head was described, however the invention is aimed at a wide general range of liquid ejecting heads, and naturally it may be applied to liquid ejecting heads that discharge liquids other than ink. As examples of other liquid ejecting heads, there are, for example, various recording heads used in image recording devices such as printers and the like, color material ejecting heads used for the manufacture of color filters used in liquid crystal displays and the like, electrode material ejecting heads for forming electrodes for organic EL displays, Field Emission Displays (FEDs) and the like, and bio-organic material ejecting heads and the like for the manufacture of biochips.

Also, the piezoelectric element of the invention is not restricted to a piezoelectric element used in a liquid ejecting head, it may also be used in other devices. As examples of other devices, there are for example, ultrasound devices such as ultrasound transmitters, ultrasound motors, thermoelectric converters, piezoelectric converters, ferroelectric transistors, piezoelectric transformers, cut off filters for harmful rays such as infrared rays, optical filters using the photonic crystal effect from the formation of quantum dots, and filters such as optical filters and the like that use thin film optical interference. Also, the invention may be applied to piezoelectric elements used as sensors, and to piezoelectric elements used as ferroelectric memory. As examples of sensors which use piezoelectric elements, there are for example, infrared sensors, ultrasound sensors, heat sensors, pressure sensors, pyroelectric sensors, gyro-sensors (angular velocity sensors) and the like.

What is claimed is:

1. A method of manufacturing a piezoelectric head equipped with a piezoelectric layer and an electrode provided on the piezoelectric layer, the method comprising:

forming the piezoelectric layer, which is made from a complex oxide having a perovskite structure containing Bi, Fe, Ba and Ti, and which has a residual stress of 250 MPa or more, wherein the complex oxide has the formula $(Bi_{1-a}Ba_a)(Fe_{1-b}Ti_b)O_3$, where $1.17 \leq b/a \leq 1.45$, $2.3 \leq (1-a)/a \leq 4.0$.

2. A piezoelectric element equipped with a piezoelectric layer and an electrode provided on the piezoelectric layer, comprising:

the piezoelectric layer, which is made from a complex oxide having a perovskite structure containing Bi, Fe, Ba and Ti, and which has a residual stress of 250 MPa or more, wherein the complex oxide has the formula $(Bi_{1-a}Ba_a)(Fe_{1-b}Ti_b)O_3$, where $1.17 \leq b/a \leq 1.45$, $2.3 \leq (1-a)/a \leq 4.0$.

* * * * *